(12) United States Patent
Harvilchuck et al.

(10) Patent No.: US 9,832,906 B2
(45) Date of Patent: Nov. 28, 2017

(54) MIDPLANE DOCKING SYSTEM

(71) Applicant: Seagate Technology LLC, Cupertino, CA (US)

(72) Inventors: Laurence A. Harvilchuck, Brackney, PA (US); Alex Carl Worrall, Waterlooville (GB)

(73) Assignee: Seagate Technology LLC, Cupertino, CA (US)

( * ) Notice: Subject to any disclaimer, the term of this patent is extended or adjusted under 35 U.S.C. 154(b) by 202 days.

(21) Appl. No.: 14/751,498

(22) Filed: Jun. 26, 2015

(65) Prior Publication Data
US 2016/0380399 A1 Dec. 29, 2016

(51) Int. Cl.
| | |
|---|---|
| H01R 27/02 | (2006.01) |
| H01R 13/213 | (2006.01) |
| H05K 7/14 | (2006.01) |
| G06F 1/16 | (2006.01) |

(52) U.S. Cl.
CPC ............. H05K 7/1492 (2013.01); G06F 1/16 (2013.01); H01R 13/213 (2013.01)

(58) Field of Classification Search
CPC ........ H05K 7/1492; G06F 1/16; H01R 13/213
See application file for complete search history.

(56) References Cited

U.S. PATENT DOCUMENTS

| | | | | |
|---|---|---|---|---|
| 5,192,226 A | * | 3/1993 | Wang ..................... | H01R 31/02 439/502 |
| 5,227,957 A | * | 7/1993 | Deters .................... | G06F 1/181 312/223.2 |
| 5,340,331 A | * | 8/1994 | Bohlen .................. | H02B 1/202 439/502 |
| 5,540,597 A | * | 7/1996 | Budman ............. | G06F 13/4063 361/679.4 |
| 5,613,033 A | | 3/1997 | Swamy et al. | |
| 5,673,478 A | | 10/1997 | Beene et al. | |
| 5,697,810 A | * | 12/1997 | Barry ..................... | B60T 17/04 244/1 R |
| 5,701,233 A | | 12/1997 | Carson et al. | |
| 5,855,494 A | * | 1/1999 | Blaszczyk .............. | H01R 31/02 361/735 |
| 6,038,130 A | | 3/2000 | Boeck et al. | |
| 6,062,910 A | * | 5/2000 | Braquet ............... | H01R 31/065 439/578 |
| 6,142,796 A | * | 11/2000 | Behl ...................... | G06F 1/181 361/679.33 |
| 6,190,199 B1 | * | 2/2001 | Bump .................... | H01R 31/06 439/502 |
| 6,297,962 B1 | | 10/2001 | Johnson et al. | |

(Continued)

*Primary Examiner* — Briggitte R Hammond
(74) *Attorney, Agent, or Firm* — Taylor English Duma LLP

(57) ABSTRACT

Technologies for midplane docking systems for connecting adjacent levels of docks are provided herein. An extendable connection system includes: a connector cable, the connector cable having a first end and a second end; a male connector, the male connector connected to the first end of the connector cable, the male connector including male connecting mechanism; and a female connector, the female connector connected to the second end of the connector cable and including a female connecting mechanism adapted to connect with the male connecting mechanism, wherein the male connector is extendable relative to the female connector.

19 Claims, 7 Drawing Sheets

(56) References Cited

U.S. PATENT DOCUMENTS

| | | | |
|---|---|---|---|
| 6,418,027 B1 * | 7/2002 | Suzuki | G06F 1/183 |
| | | | 361/679.02 |
| 6,483,709 B1 | 11/2002 | Layton | |
| 6,521,836 B1 * | 2/2003 | Simonazzi | H01R 13/72 |
| | | | 174/74 A |
| 6,741,463 B1 | 5/2004 | Akhtar et al. | |
| 6,822,859 B2 | 11/2004 | Coglitore et al. | |
| 6,909,609 B1 * | 6/2005 | Chen | H05K 7/1421 |
| | | | 361/724 |
| 7,029,312 B2 * | 4/2006 | Reid | H01R 13/44 |
| | | | 439/367 |
| 7,094,971 B2 * | 8/2006 | Johnsen | H01R 24/547 |
| | | | 174/84 R |
| 7,123,477 B2 | 10/2006 | Coglitore et al. | |
| 7,187,265 B1 | 3/2007 | Senogles et al. | |
| 7,189,106 B2 * | 3/2007 | Young | H02G 11/02 |
| | | | 174/67 |
| 7,564,692 B2 | 7/2009 | Hsiung | |
| 8,441,793 B2 | 5/2013 | Dunwoody et al. | |
| 8,589,609 B2 | 11/2013 | Hilburn | |
| 8,834,209 B2 * | 9/2014 | Conrad | H01R 13/6456 |
| | | | 439/680 |
| 8,854,831 B2 | 10/2014 | Arnouse | |
| 2002/0001998 A1 * | 1/2002 | Lo | H01R 31/06 |
| | | | 439/502 |
| 2007/0081308 A1 | 4/2007 | Ishida | |
| 2009/0097192 A1 * | 4/2009 | Riddiford | B60R 11/0258 |
| | | | 361/679.01 |
| 2009/0104811 A1 * | 4/2009 | Sumida | H01R 13/72 |
| | | | 439/501 |
| 2011/0278250 A1 | 11/2011 | Malekmadani | |
| 2012/0106304 A1 * | 5/2012 | Strauser | G06F 1/1632 |
| | | | 368/276 |
| 2012/0111817 A1 | 5/2012 | Sweeny et al. | |
| 2012/0122335 A1 * | 5/2012 | Costello | H04Q 1/025 |
| | | | 439/502 |
| 2012/0241195 A1 * | 9/2012 | Doll | H04R 1/1033 |
| | | | 174/135 |
| 2013/0141863 A1 | 6/2013 | Ross et al. | |
| 2013/0337684 A1 * | 12/2013 | Luther | H01R 13/504 |
| | | | 439/606 |
| 2013/0342991 A1 | 12/2013 | Sun | |

* cited by examiner

MIDPLANE DOCKING SYSTEM

SUMMARY

Disclosed are technologies for midplane docking systems. According to some examples, a midplane docking system includes a connection system for connecting adjacent levels of docks within in midplane docking system. The connection system may permit vertical translation of the docks while maintaining connections between adjacent docks.

Also disclosed are technologies for monolithic or adaptable, singular design "lift and shift" drive carrier systems. According to some examples, the monolithic drive carrier system includes interlocking drive arrays and reinforcements that are combined and used in lieu of drawers in a rack-mounted enclosure. These technologies can be combined together in some embodiments to allow for data storage or other electronics systems to have flexible access to various components while maintaining connections in either the electrical or physical sense between other components of the system. This can be thought of as a "lift and shift" system where a component in the middle of a vertical stack can be accessed using the disclosed technologies to lift those components above or adjacent to the target component and then shift that component in some capacity that could include removing that component in some embodiments.

Various implementations described in the present disclosure may include additional systems, methods, features, and advantages, which may not necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

The features and components of the following figures are illustrated to emphasize the general principles of the present disclosure. Corresponding features and components throughout the figures may be designated by matching reference characters for the sake of consistency and clarity.

DETAILED DESCRIPTION

Figure 1:
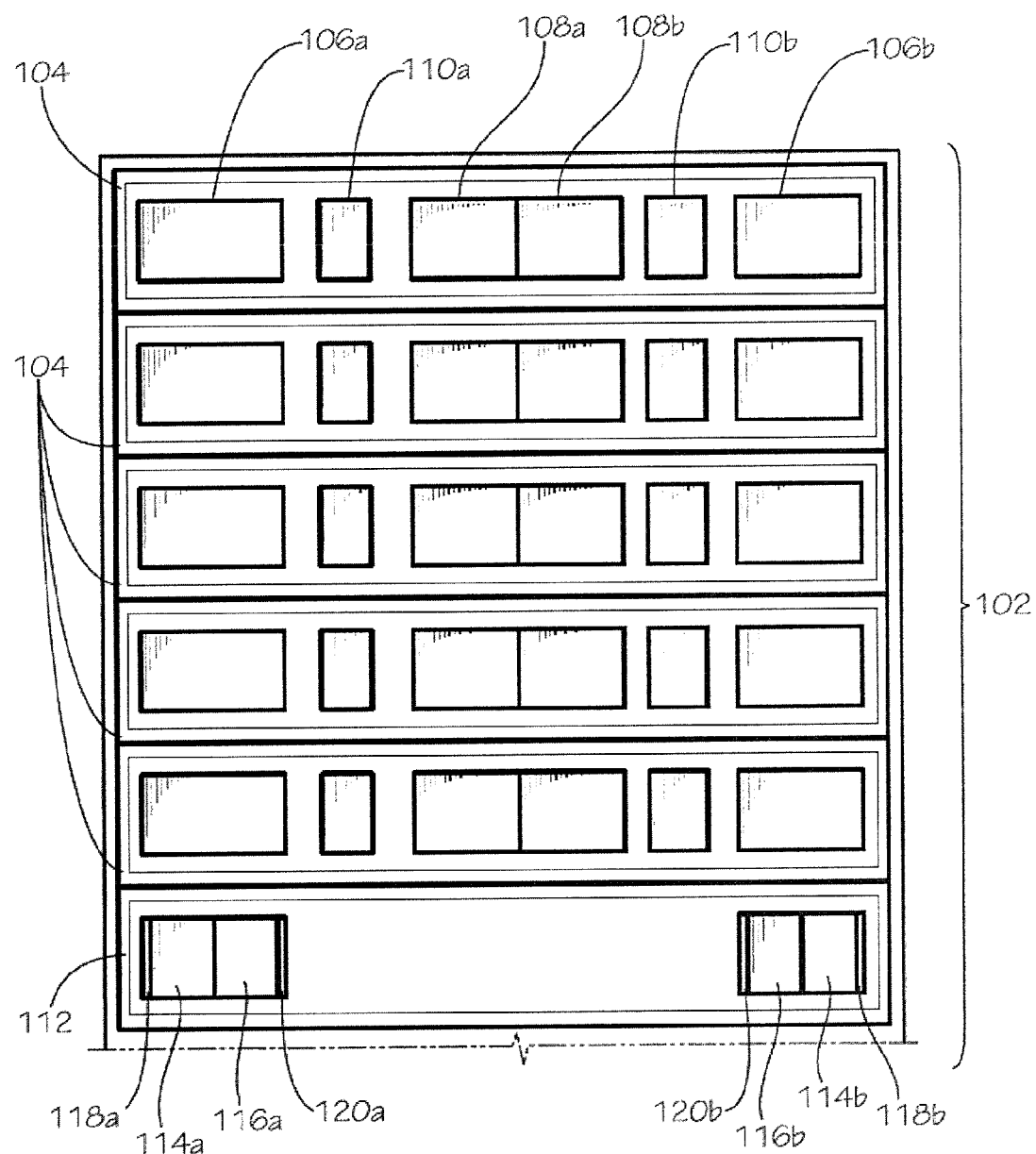
FIG. 1 is a front view of an equipment rack with a midplane docking system according to some examples of the present disclosure, including a carrier-level dock and a module-level dock.

Electronic systems, such as computer systems, have various electronic components. Computer systems that are rack-based include many rack-mounted components in a high-density arrangement. However, the high-density arrangement may make it difficult for a technician to access specific locations or items in the system without disrupting connections between various other components of the system. Therefore, maintaining connectivity within a computer system during maintenance is an important consideration for rack-based electronic systems.

The following detailed description is directed to technologies for midplane docking systems and associated methods, systems, devices, and various apparatus. In some examples, midplane docking systems are used with midplane docking systems for electronic or computer systems. In various examples, midplane docking systems contain a number of removable modules that may hold one or more electronic components, including, but not limited to, central processing units, data storage devices, networking or communication equipment, video processing equipment, and various other electronic components mounted in equipment racks. An important design configuration for the midplane docking systems is to utilize most of the space within the carrier with placement of electronic components, such as computer servers, controllers, switches, and various other functional equipment, and to minimize the support or peripheral equipment, such as power distribution devices, power supply cables, and other peripheral equipment within the carrier. To maximize the space within the midplane docking system, the modules may be stacked on top of each other within the midplane docking system.

The midplane docking systems may include carrier-level docks and module-level docks. The various docks serve as a hub for interconnection between components within the midplane docking system and components external to the midplane docking system. In various examples, the midplane docking system includes a plurality of docks. The docks may be interconnected through a series of vertical connectors. In various examples, a technician may need to access a target dock within the midplane docking system. To access the target dock, the docks stacked above the target dock must be vertically translated a sufficient distance. It is desirable in many instances to maintain the vertical interconnection between adjacent levels of docks within the midplane docking system even as docks are vertically translated as necessary for maintenance or removal.

According to examples, an extendable connection system may be utilized in the midplane docking system. In various examples, the extendable connection system permits sufficient vertical translation between adjacent levels in a midplane docking system while maintaining a connection between the vertically adjacent levels, such as vertically adjacent docks. A single target dock may be connected or disconnected and removed from the midplane docking system as needed during use. Additionally, the vertical translation of adjacent levels is accomplished while reducing noise signals from conventional slidable connection systems. As used herein, directional references such as "up," "down," "top," "left," "right," "front," "back," and "corners," among others are intended to refer to the orientation as shown and described in the figure (or figures) to which the components and directions are referencing.

FIG. 1 and the following description are intended to provide a general description of a suitable environment in which the examples described herein may be implemented. In particular, FIG. 1 shows an illustrative midplane docking system 102 according to the examples provided herein. The midplane docking system 102 may include at least one carrier-level dock 104 and at least one module-level dock 112. In various examples, the midplane docking system 102 may include a plurality of carrier-level docks 104 connected to the module-level dock 112.

Figure 2:
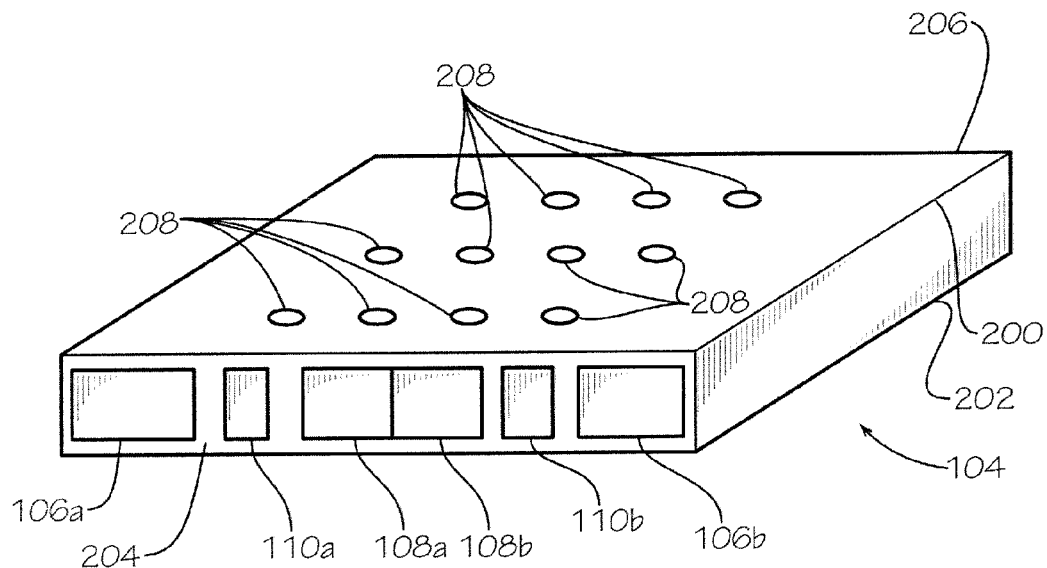
FIG. 2 is a perspective view of the carrier-level dock of FIG. 1 including connector channels, I/O connectors, power input connectors, carrier-level connector channels, and power output connectors.

In various examples, each carrier-level dock 104 is a hub for interconnection between components on different levels within the midplane docking system 102 and also for interconnection between components within the midplane docking system 102 and components external to the midplane docking system 102. In various examples, each carrier-level dock 104 includes various connectors enabling interconnection between various components. In the present embodiment, as shown in FIGS. 1 and 2, the carrier-level dock 104 includes I/O connectors 106a,b, power input connectors 108a,b, and power output connectors 110a,b; however, the disclosure of I/O connectors 106, power input connectors 108, or power output connectors 110 should not be considered limiting on the current disclosure as in various other examples, any connectors utilized by an electronic or computer system may be included with the carrier-level dock 104. Additionally, the number of connectors included with the carrier-level dock 104 should not be considered limiting on the current disclosure as in various examples, the carrier-level dock 104 has any desired number of connectors and any desired combination of connectors. In the present embodiment, the power input connectors 108 are AC input connectors and the power output connectors 110 are DC output connectors; however, in various other examples, the power connectors may be any desired type of power connectors.

In various examples, the module-level dock 112 may support the use of cooling modules within the midplane docking system 102. As shown in FIG. 1, in various examples, the module-level dock 112 includes first coolant channels 114a,b and second coolant channels 116a,b. The number of coolant channels 114 or coolant channels 116 should not be considered limiting on the current disclosure as in various other embodiments, the module-level dock 112 may include any desired number of coolant channels 114 or coolant channels 116, including zero coolant channels 114 or zero coolant channels 116. In various examples, a cooling module is connected to the first coolant channels 114 and the second coolant channels 116 such that a cooling fluid may flow to and from the cooling module to the first coolant channel 114s and the second coolant channel 116s in the module-level dock 112. From the module-level dock 112, the cooling fluid may be directed to various locations in the midplane docking system where cooling of equipment is desired.

As shown in FIG. 1, in various examples, the module-level dock 112 may also support the use of power modules. In various examples, the module-level dock 112 includes at least one voltage bus bar 118 and at least one ground bus bar 120. In various examples, the voltage bus bar 118 is housed in the first coolant channel 114 and the ground bus bar 120 is housed in the second coolant channel 116; however, the location of the voltage bus bar 118 or the ground bus bar 120 in the module-level dock 112 should not be considered limiting on the current disclosure. In various other examples, the voltage bus bar 118 is housed in the second coolant channel 116 and the ground bus bar 120 is housed in the first coolant channel 114. In various other examples, the voltage bus bar 118 and ground bus bar 120 are included with the module-level dock 112 at locations other than in the first coolant channel 114 or second coolant channel 116.

FIG. 2 shows one carrier-level dock 104 of the midplane docking system 102 according to some examples. As shown in FIG. 2, the carrier-level dock 104 includes a top end 200, a bottom end 202, a front end 204, and a back end 206. In various examples, the carrier-level dock 104 includes I/O connectors 106, power input connectors 108, and power output connectors 110 at the front end 204. The carrier-level dock 104 also includes similar connectors (not shown) at the back end 206 in various examples.

As shown in FIG. 2, in various examples, the carrier-level dock 104 includes at least one carrier vertical connector channel 208. In the present embodiment, the carrier-level dock 104 includes a plurality of carrier vertical connector channels 208. The number or pattern of the carrier vertical connector channels 208 should not be considered limiting on the current disclosure. In various examples, the carrier vertical connector channel 208 includes a power bus. In various examples, the power bus may be a DC power bus or an AC power bus. In the present embodiment, the carrier-level dock 104 includes a plurality of carrier vertical connector channels 208. In various examples, the carrier vertical connector channels 208 may include any combination of power busses or may include other connections, such as I/O connections or various other connections that are part of the electronic system.

Figure 3:
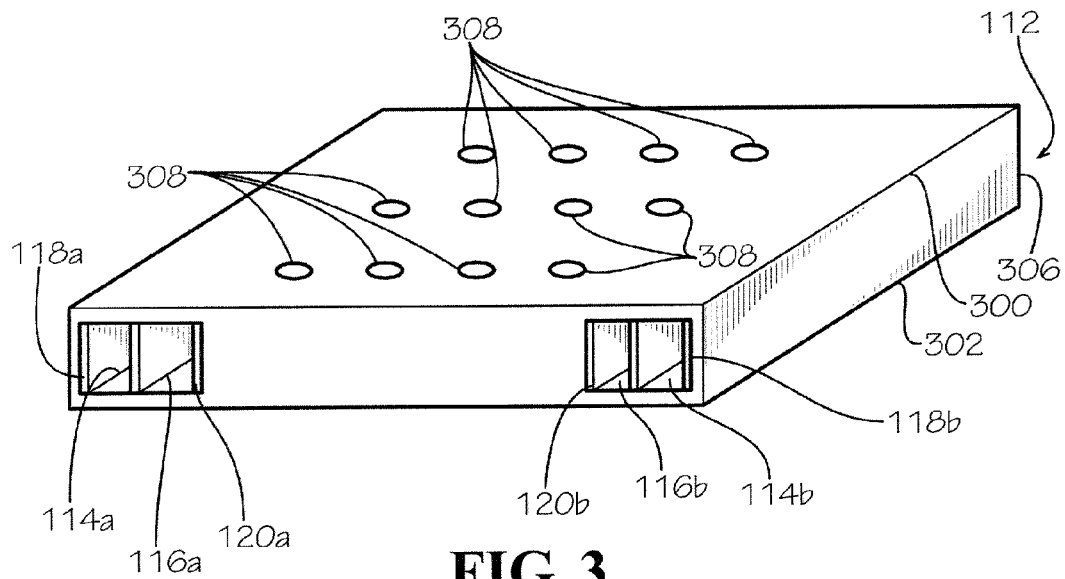
FIG. 3 is a perspective view of the module-level dock of FIG. 1 including coolant channels, connector channels, and bus bars.

FIG. 3 shows the module-level dock 112 of the midplane docking system 102 according to some examples. As shown in FIG. 3, the module-level dock 112 includes a top end 300, a bottom end 302, a front end 304, and a back end 306. As previously described, in various examples, the module-level dock 112 includes at least one first coolant channel 114 and at least one second coolant channel 116. In various examples, the coolant channels 114,116 may extend through the module-level dock from the front end 304 to the back end 306. In various examples, the module-level dock 112 includes at least one voltage bus bar 118 and at least one ground bus bar 120 housed in the coolant channels 114,116.

As shown in FIG. 3, in various examples, the module-level dock 112 includes at least one module vertical connector channel 308. In the present embodiment, the car module-level dock 112 includes a plurality of module vertical connector channel 308. The number or pattern of the module vertical connector channel 308 should not be considered limiting on the current disclosure. In various examples, the module vertical connector channel 308 includes a power bus. In various examples, the power bus may be a DC power bus or an AC power bus. In the present embodiment, the module-level dock 112 includes a plurality of module vertical connector channels 308. In various examples, the module vertical connector channels 308 may include any combination of power busses or may include other connections, such as I/O connections or various other connections that are part of the electronic system.

Figure 4:
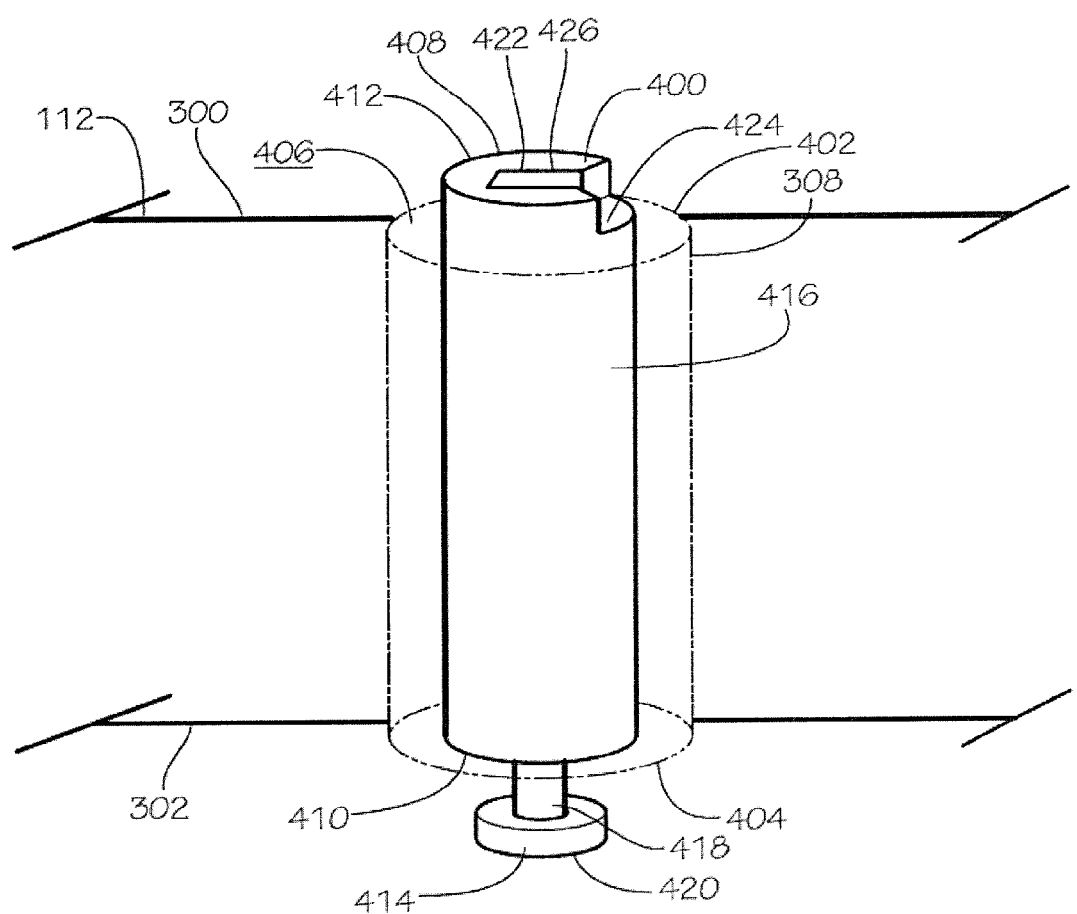
FIG. 4 is a perspective view of the module-level connector channel of FIG. 3 including a module-level connection system.

FIG. 4 shows a perspective view of one module vertical connector channel 308 housing an extendable module connector system 400 according to some examples. In various examples, the module vertical connector channel 308 defines a top opening 402 at the top end 300 of the module-level dock 112 and a bottom opening 404 at the bottom end 302 of the module-level dock 112. In various examples, the module vertical connector channel 308 may define a generally tubular shape. However, the shape of the module vertical connector channel 308 should not be considered limiting on the current disclosure as in various other examples, the connector channel may have any desired shape. In various examples, an inner surface 406 of the module vertical connector channel 308 extends from the top opening 402 to the bottom opening 404.

As shown in FIG. 4, in various examples, the module vertical connector channel 308 houses an extendable module connector system 400. In various examples, the module connector system includes a top end 408 and a bottom end 410. In various examples, the extendable module connector system 400 includes a top module connector 412 at the top end 408 and a bottom module connector 414 at the bottom end 410. In various examples, the top module connector 412 and the bottom module connector 414 may be any suitable male/female connections with mateable connection mechanisms. In various examples, the extendable module connector system 400 is snapped into vertical connector channel 308. The extendable module connector system 400 may be held in the vertical connector channel 308 through various connecting mechanisms in various examples. In other examples, the module connector system 400 is held in the vertical connector channel 308 by friction caused by the module connector system 400 engaging the vertical connector channel 308 due to the relative sizing of the two components. In other examples, the extendable module connector system 400 is present in vertical connector channel 308 in a loose fashion and the module connector system 400 may move within the vertical connector channel 308.

The top module connector 412 and bottom module connector 414 may be electrically conductive. In various examples, the top module connector 412 and bottom module connector 414 are connected through a module connector body 416. In various embodiments, the module connector body 416 is rod-shaped. In various embodiments, the top module connector 412 is integrally formed with the module connector body 416; however in various other examples, the top module connector 412 is connected to the module connector body 416 through various connection mechanisms. In various other examples, the top module connector 412 and bottom module connector 414 are connected through a connector cable (not shown). In various examples, the module connector body 416 or cable enables electrical communication between the top module connector 412 and the bottom module connector 414. In various other examples, the top module connector 412 and bottom module connector 414 are connected through various other connecting mechanisms. In various examples, the module connector body 416 is connected to the module-level dock 112 via physical interlocking and engagement of the respective complementary features.

According to some embodiments, the bottom module connector 414 includes a module connector post 418. In various examples, the module connector post 418 includes a module key 420 such that the module connector post 418 is mateable with a carrier connector socket 532 (shown in FIG. 5) on an adjacent carrier-level dock 104 in the midplane docking system 102. In various examples, the module key 420 is dimensioned such that the module key 420 cannot be vertically removed from the carrier connector socket 532. As described in greater detail below, the carrier connector socket 532 may define a side socket opening 534 and a top socket opening 536. In various examples, the module key 420 is insertable through the side socket opening 534 but not through the top socket opening 536. The profile of the top socket opening 536 prevents the module key 420 from being removed upward from the carrier connector socket 532. The module connector post 418 extends through the top socket opening 536 such that the module key 420 attaches to the carrier connector socket 532. To unmate the module-level dock 112 from the carrier connector socket 532, the module connector post 418 and module key 420 are removed from the carrier connector socket 532 through the side socket opening 534.

In various examples, the top module connector 412 is continuously formed with the module connector body 416 or connected with the module connector body 416 through various connecting mechanisms including, but not limited to, welding, adhesives, or various other connecting mechanisms. In various examples, the top module connector 412 defines a module connector socket 426 in the module connector body 416. In various examples, the top module connector 412 defines an end module socket opening 424 and a top module socket opening 422 in the module connector body 416. In various other examples, the top module connector 412 is connected to the module connector body 416. In the various examples, the top module connector 412 may include a top connector body defining the module connector socket 426, the end module socket opening 424, or the top module socket opening 422.

In various examples, the end module socket opening 424 is dimensioned to accept a carrier connector post 526 and carrier key 528 (shown in FIG. 5) of a carrier-level dock 104 into the module connector socket 426 such that the carrier-level dock 104 and module-level dock 112 are mated. In various examples, the top module socket opening 422 is dimensioned to allow the carrier connector post 526 and carrier key 528 to be movably positioned in the module connector socket 426 while keeping the top module connector 412 mated with the carrier connector post 526 and carrier key 528. In this manner, vertical movement of the carrier-level dock 104 in relation to the module-level dock 112 does not unmate the carrier-level dock 104 from the module-level dock 112. In various examples, the carrier key 528 is dimensioned such that it cannot be removed through the top module socket opening 422 through vertical translation. To unmate the carrier-level dock 104 from the top module connector 412, the carrier connector post 526 and carrier key 528 are removed from the module connector socket 426 through the end module socket opening 424. In examples the mated module-level dock 112 and carrier-level dock 104 do not move independently from each other when mated. The disclosure of the module connector post 418, module key 420, or module connector socket 426 should not be considered limiting on the current disclosure as in various other examples, any suitable connection mechanism with male and female connectors may be utilized.

Figure 5:
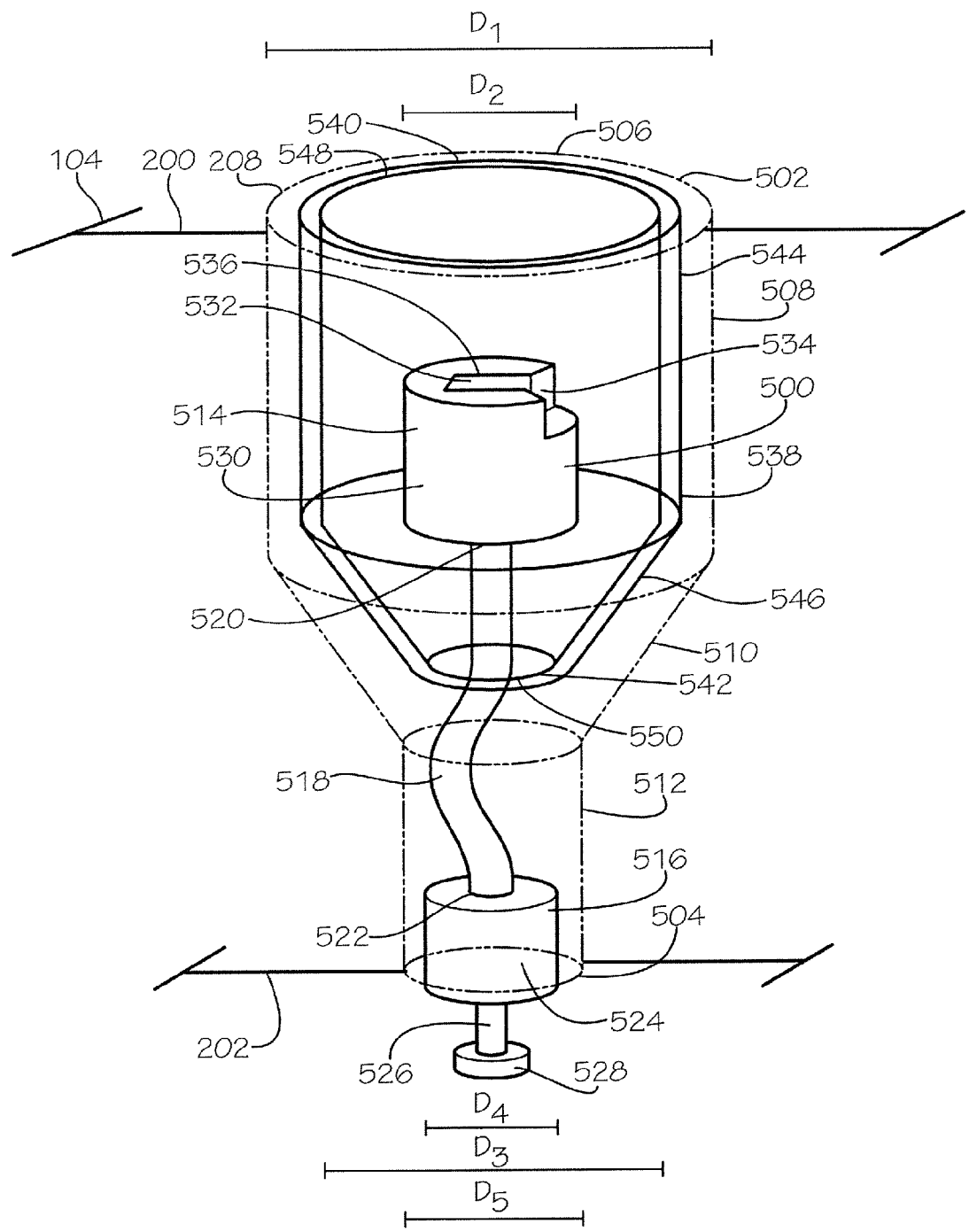
FIG. 5 is a detailed view of the carrier-level connector channel of FIG. 2 and carrier-level connection system including a top connector and bottom connector.

FIG. 5 shows a detailed view of one carrier vertical connector channel 208 housing an extendable carrier connector system 500 according to some examples. In various examples, the carrier vertical connector channel 208 includes a top end 502 and a bottom end 504. In various examples, the carrier vertical connector channel 208 defines a top opening 506 at the top end 502 of the carrier-level dock 104. As shown in FIG. 5, in various embodiments, the carrier vertical connector channel 208 includes a first lateral wall 508, an angled wall 510, and a second lateral wall 512. In various embodiments, the first lateral wall 508 and second lateral wall 512 are substantially cylindrical. A diameter $D_1$ of the first lateral wall 508 is greater than or equal to a diameter $D_2$ of the second lateral wall 512. In various other examples, the carrier vertical connector channel 208 may define a generally tubular shape. The shape of the carrier vertical connector channel 208 should not be considered limiting on the current disclosure. For example, in various other examples, the carrier vertical connector channel 208 may have curved wall portions, angled wall portions, or any other desired shaped wall portions.

As shown in FIG. 5, in various examples, the carrier vertical connector channel 208 houses the extendable carrier connector system 500. The channel 208 houses the connector system 500 in a similar fashion as described above in FIG. 4. In various examples, the extendable carrier connector system 500 includes a top connector 514 and a bottom connector 516. In various examples, the top connector 514 and bottom connector 516 are electrically conductive. According to various examples, the connectors 412, 414, 514, 516 are configured to transmit data or power signals between separate electrical devices (not shown).

In various examples, the top connector 514 and the bottom connector 516 are connected through a connector cable 518. In various examples, the connector cable 518 enables electrical communication between the top connector 514 and the bottom connector 516. As shown in FIG. 5, the connector cable 518 includes a top end 520 and a bottom end 522. In various examples, the top end 520 is connected to the top connector 514 and the bottom end 522 is connected to the bottom connector 516. In various embodiments, a distance from the top end 520 to the bottom end 522 of the connector cable 518 is greater than a distance from the top end 502 to the bottom end 504 of the carrier vertical connector channel 208 such that the carrier connector system 500 is extendable.

In various examples, the bottom connector 516 includes a hub 524 and the carrier connector post 526. In various examples, the carrier connector post 526 includes the carrier key 528 which is mateable with the top connector 514 of an adjacent carrier-level dock 104 or the top module connector 412 of an adjacent module-level dock 112. The hub 524 may be connected to the carrier vertical connector channel 208 at the bottom end 504. In various examples, the hub 524 is connected to the bottom end 504 such that a portion of the hub 524 extends below the bottom end 202 of the carrier-level dock 104.

In various examples, the top connector 514 includes the carrier connector body 530 defining the carrier connector socket 532 in the connector body 530. In various examples, the connector body 530 defines the side socket opening 534 and the top socket opening 536. The side socket opening 534 is orientated to face a side of the connector body 530 and may be dimensioned to accept the carrier connector post 526 and carrier key 528 into the carrier connector socket 532. In various examples, adjacent carrier-level docks 104 are mated by positioning the carrier connector post 526 and carrier key 528 of an adjacent carrier-level dock 104 into the carrier connector socket 532 of another carrier-level dock 104. The top socket opening 536 is dimensioned to allow the carrier connector post 526 and carrier key 528 of the adjacent carrier-level dock 104 to be movably positioned in the carrier connector socket 532 while keeping the adjacent carrier-level docks 104 mated through the top connector 514 and bottom connector 516. The profile of the top socket opening 536 prevents the carrier key 528 from being removed upward from the carrier connector socket 532. The carrier connector post 526 extends through the top socket opening 536 such that the carrier key 528 attaches to the carrier connector socket 532. In various examples, the carrier key 528 is dimensioned such that the carrier key 528 cannot be removed upward through the top socket opening 536. In this manner vertical movement between a mated top connector 514 and bottom connector 516 will not disengage the top connector 514 from the bottom connector 516. To unmate the top connector 514 from the bottom connector 516, the carrier connector post 526 and carrier key 528 are moved from the carrier connector socket 532 through the side socket opening 534.

As shown in FIG. 5, in various examples, the extendable carrier connector system 500 includes a jacket 538 having a top end 540 and a bottom end 542. In various examples, the jacket 538 includes a lateral side wall 544 and an angled side wall 546 between the top end 540 and the bottom end 542. In various examples, the lateral side wall 544 is cylindrical. The lateral side wall 544 defines a top jacket opening 548 at the top end 540 and the angled side wall 546 defines a bottom jacket opening 550 at the bottom end 542. As shown in FIG. 4, in various examples, a diameter $D_3$ of the top jacket opening 548 is greater than a diameter $D_4$ of the bottom jacket opening 550. In various examples, the diameter $D_4$ of the bottom jacket opening 550 is less than a diameter $D_5$ of the top connector 514. In this manner, the top connector 514 may not pass through the bottom jacket opening 550.

As shown in FIG. 5, the jacket 538 may be positioned on the connector cable 518 between the top connector 514 and the bottom connector 516. In these examples, the connector cable 518 may extend through the bottom jacket opening 550. The jacket 538 may be utilized to aid in alignment of the carrier connector post 526 and carrier key 528 of an adjacent carrier-level dock 104, or the module connector post 418 and module key 420 of an adjacent module-level dock 112, with the side socket opening 534 positioned such that the carrier connector post 526 and carrier key 528 or the module connector post 418 and module key 420 may be inserted into the carrier connector socket 532. In various examples, the jacket 538 also aids in maintaining the integrity of the connection between the top connector 514 and the bottom connector 516 of an adjacent carrier-level dock 104 when the carrier connector post 526 and carrier key 528 are inserted into the carrier connector socket 532. The jacket 538 may also aid in maintaining the integrity of the connection between the top connector 514 and the bottom module connector 414 of an adjacent module-level dock 112 when the module connector post 418 and module key 420 are inserted into the carrier connector socket 532. In various examples, the tapered jacket 538 may reduce unwanted disengagement of adjacent carrier-level docks 104 or a module-level dock 112 adjacent to the carrier-level dock 104 such that the top connector 514 and bottom connector 516 or bottom module connector 414 remain connected during vertical translation of the carrier-level docks 104 or module-level docks 112, such as during assembly or service. The disclosure of the carrier connector post 526, carrier key 528, or connector socket 532 should not be considered limiting on the current disclosure as in various other examples, any suitable connection mechanism with male and female connectors adapted may be utilized.

Figure 6:
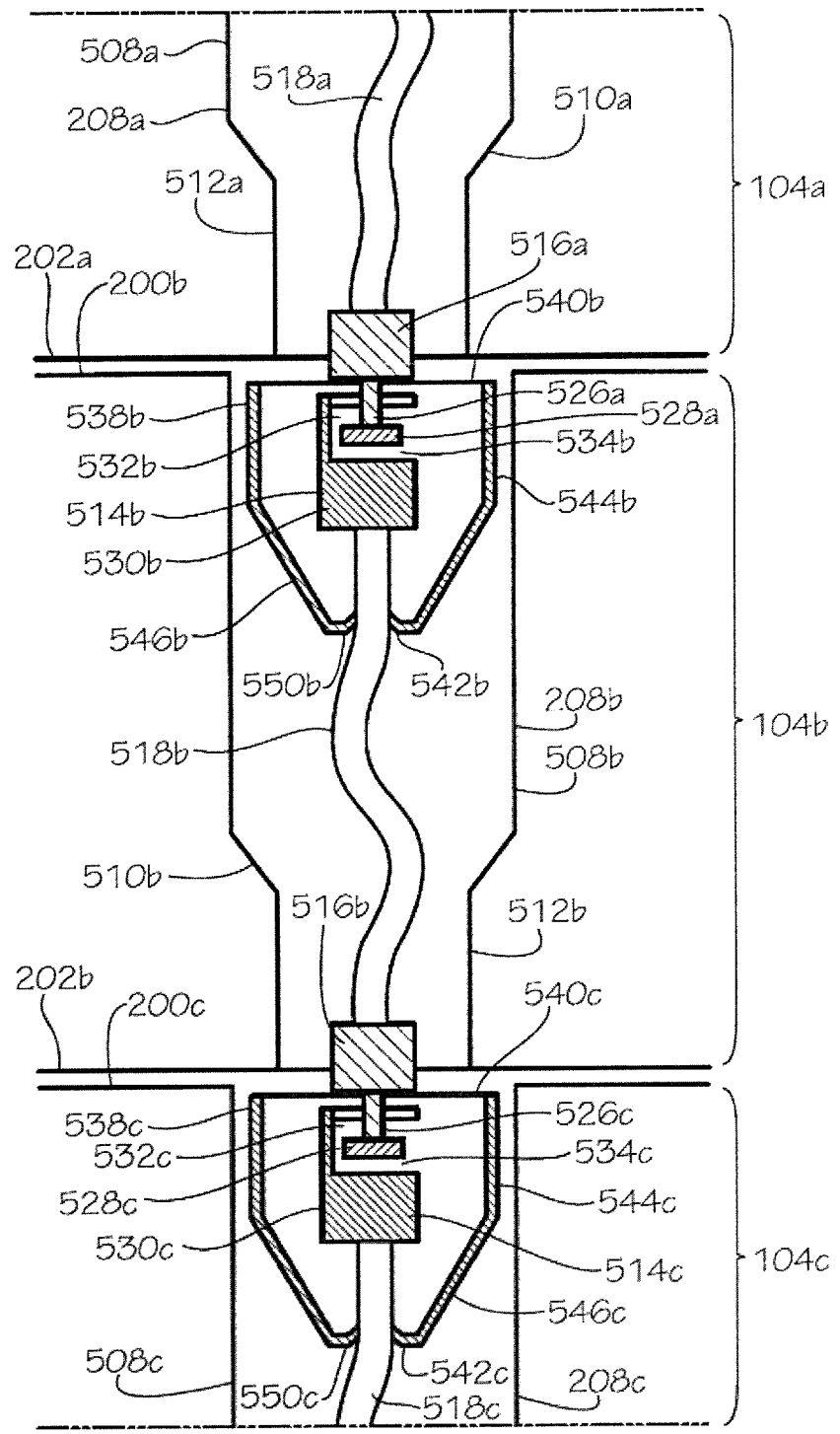
FIG. 6 is a detailed view of three vertically adjacent carrier-level docks with the carrier-level connection system of FIG. 5 in a neutral position.

FIG. 6 shows a partial cross-sectional view of three adjacent vertically stacked carrier-level docks 104a,b,c in a neutral position. As shown in FIG. 6, each carrier-level dock 104a,b,c includes the top end 200a,b,c (top end 200a not shown), the bottom end 202a,b,c (bottom end 202c not shown), and defines the carrier vertical connector channel 208a,b,c having the first lateral wall 508a,b,c, the angled wall 510a,b,c (angled wall 510c not shown), and the second lateral wall 512a,b,c (second lateral wall 512c not shown), respectively. Each carrier-level dock 104a,b,c includes the top connector 514a,b,c (top connector 514a not shown), the bottom connector 516a,b,c (bottom connector 516c not shown), and the connector cable 518a,b,c, respectively. In various examples, each bottom connector 516a,b,c includes the hub 524a,b,c (hub 524c not shown), the carrier connector post 526,a,b,c (carrier connector post 526c not shown), and the carrier key 528a,b,c (carrier key 528c not shown), respectively. In various examples, each top connector 514a, b,c includes the connector body 530a,b,c (connector body 530a not shown) defining the carrier connector socket 532a,b,c (connector socket 532a not shown) in the connector body 530a,b,c, respectively. Each connector body 530a, b,c defines the side socket opening 534a,b,c (side socket opening 534a not shown) and the top socket opening 536a, b,c (top socket opening 536a not shown), respectively. In various examples, the jackets 538a,b,c (jacket 538a not shown) having the top end 540a,b,c (top end 540a not shown) and the bottom end 542a,b,c (bottom end 542a not shown) are respectively included. Each jacket 538a,b,c includes the lateral side wall 544a,b,c (lateral wall 544a not shown), the angled side wall 546a,b,c (angled side wall 546a not shown), the top jacket opening 548a,b,c (top jacket opening 548a not shown), and the bottom jacket opening 550a,b,c (bottom jacket opening 550a not shown), respectively.

As shown in FIG. 6, in the neutral position, there is no vertical translation between any of the carrier-level docks 104a,b,c. The top connectors 514b,c and bottom connectors 516a,b are mated, respectively. As shown in FIG. 6, in various examples, the connector cables 518a,b,c are not fully extended and are slack. In various examples, the slack in the connector cables 518a,b,c bunches in the carrier vertical connector channels 208a,b,c, respectively. As shown in FIG. 6, in various examples, the top connectors 514b,c may be positioned below the top ends 200b,c of the carrier-level docks 104b,c and within the carrier vertical connector channels 208b,c, respectively. In various examples, in the neutral orientation, the top ends 540b,c of the jackets 538b,c may be positioned below the top ends 200b,c of the carrier-level docks 104b,c and within the carrier vertical connector channels 208b,c, respectively. In various other examples, the top ends 540b,c of the jackets 538b,c may engage the bottom of an adjacent dock, such as the bottom ends 202a,b of the adjacent carrier level docks 104a,b, respectively.

Figure 7:
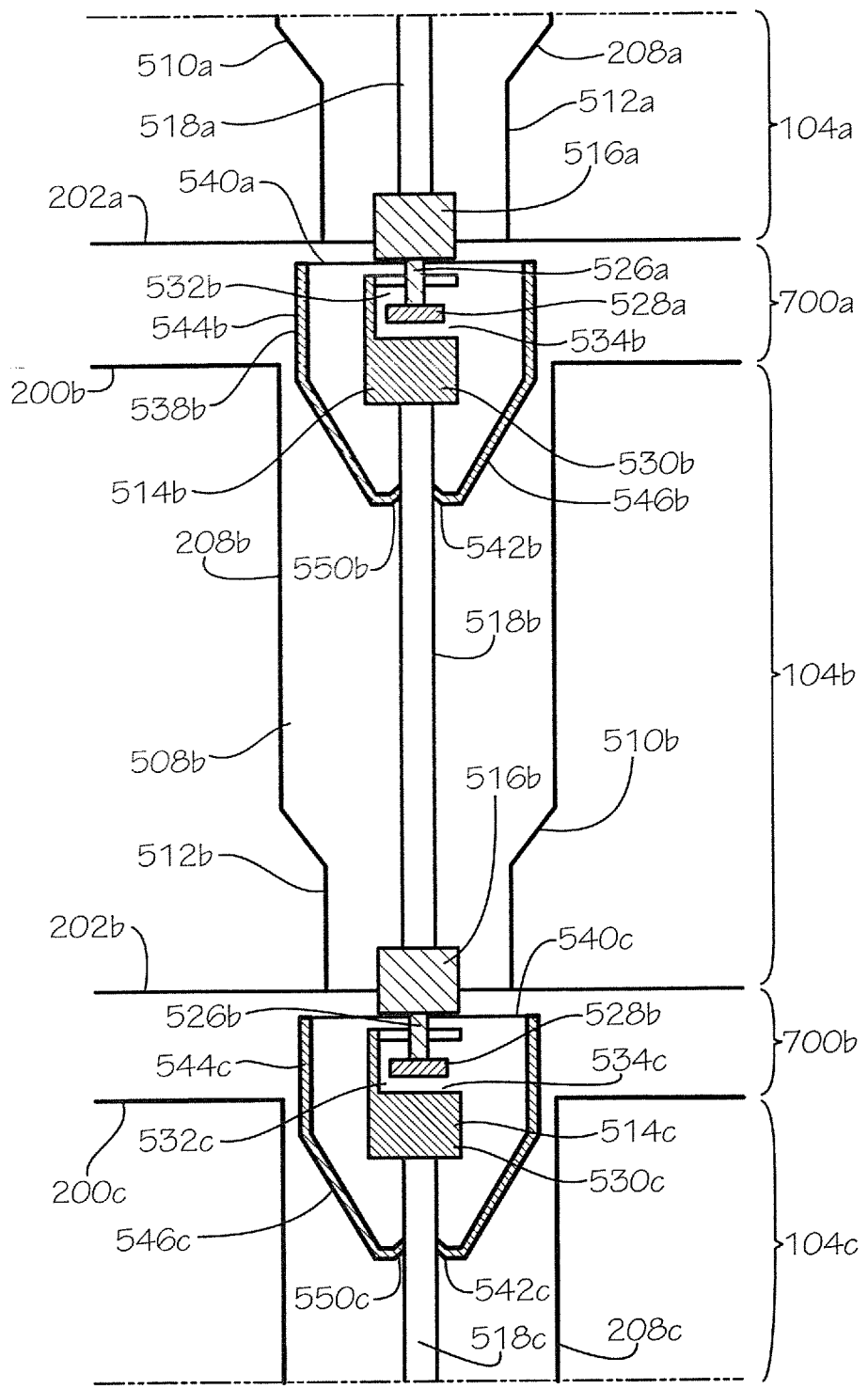
FIG. 7 is a detailed view of three vertically adjacent carrier-level docks with the carrier-level connection system of FIG. 5 in a service position.

FIG. 7 shows the three adjacent vertically carrier-level stacked docks 104a,b,c in a service position. In the service position, vertical translation exists between the carrier-level docks 104a,b,c such that gaps 700a,b exist between vertically adjacent docks 104a,b,c, respectively. In various examples, in the service position, the slack in the connector cables 518a,b,c in the neutral position is taken up and the connector cables 518a,b,c extend to a fully extended orientation, respectively. In various examples, portions of the top connectors 514a,b may be positioned above the top ends 200b,c of the carrier-level docks 104b,c and exterior to the carrier vertical connector channels 208b,c, respectively. In various examples, in the fully extended orientation, the top ends 540b,c of the jackets 538b,c may be positioned above the top ends 200b,c of the carrier-level docks 104b,c and exterior to the carrier vertical connector channels 208b,c, respectively. In various other examples, the jackets 538b,c may be held in place in the carrier vertical connector channels 208b,c and are not moved from within the carrier vertical connector channels 208b,c, respectively, in the service position. In various examples, in the service position, the mating and connection between vertically adjacent carrier-level docks 104a,b,c is maintained through the top connectors 514b,c and bottom connectors 516a,b, respectively.

The following detailed description is also directed to technologies for monolithic driver carrier systems and associated methods, systems, devices, and various apparatus. In various examples, the monolithic driver carrier systems include a pair of interlocking drive arrays and reinforcements in a midplane docking system for electronic or computer systems.

Figure 8:
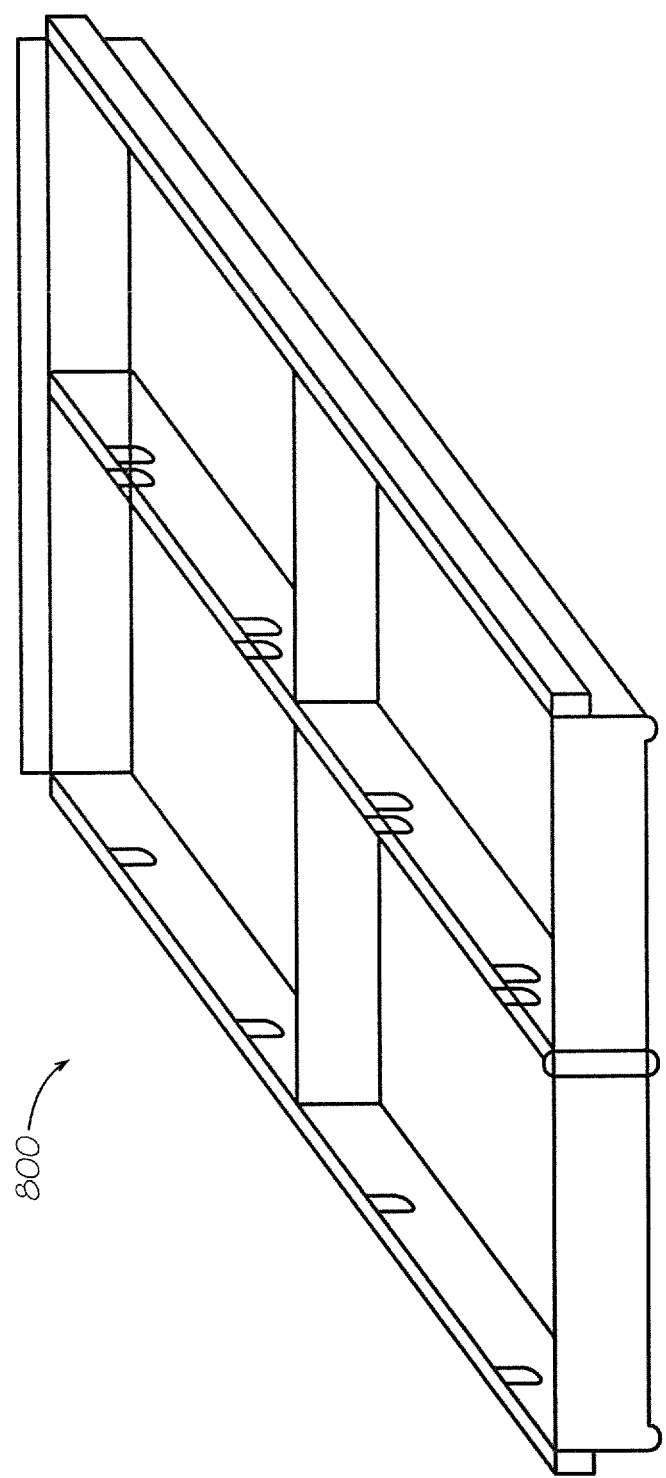
FIG. 8 is a perspective view of a monolithic drive carrier system.

FIG. 8 shows a monolithic drive carrier system 800. In various examples, the monolithic drive carrier system includes individual trays. Each tray may include bottom mating protrusions and top mating protrusions such that multiple trays may be stacked vertically. Drives may be mounted on the trays through mounting mechanisms, such as drive mounting screws. In various examples, the mounting mechanisms are recessed into channels molded into the tray. In various other examples, various other mounting mechanisms may be utilized for mounting drives on the trays.

In various examples, the trays include a vibration-damping grommet. The vibration-damping grommet and material from which the trays are constructed may reduce the vibrational impact of adjacent drives.

In various examples, on each side of the tray are channels. The channels may mate with channels or passageways on adjacent trays to provide interlock between adjacent trays or may act as rails for use with a servicing scheme. In various examples, the space created by the channels may be utilized for airflow management. The trays may also include cable management channels which may also permit the flow of air through the tray, which may assist in cooling of the trays.

In various examples, cabling that supports the drives on the trays may be bunched together at the rear of the tray by a common connector. In various examples, the common connector may be a "gender bender" or act as a passive midplane to offer distributed connectivity to the cabled drives.

In various examples, a stiffening element may be incorporated across the front and/or the rear of the trays to provide additional rigidity to the trays during handling and service operations.

In various examples, individual trays are designed for manufacture by injection molding or similar forming techniques. Each tray may only be slightly thicker than a drive the tray accommodates. In various examples, the polymer forming the trays may contribute towards minimizing the vibrational impact of adjacent drives.

In various examples, the monolithic carrier system 800 includes a first monolithic carrier and a second monolithic carrier. In various examples, the first monolithic carrier and the second monolithic carrier house various electrical devices. In various examples, the electrical devices housed by the first monolithic carrier and the second monolithic carrier include data storage devices; however, the disclosure of data storage devices should not be considered limiting on the current disclosure as in various other examples, the monolithic carriers may house various other electrical devices. In various examples, the second monolithic carrier is stacked on top of the first monolithic carrier.

According to various examples, the first monolithic carrier may engage any of the carrier-level docks 104 or the module-level docks 112 and the second monolithic carrier may engage any of the carrier level docks 104 or module-level docks 112 of the midplane docking system 102. According to various examples, the second monolithic carrier is lifted and moved to a service position relative to the first monolithic carrier such that a gap, which may be similar to gaps 700, is formed between the first monolithic carrier and the second monolithic carrier. Movement of the second monolithic carrier to the service position moves the adjacent docks connected to the monolithic carriers, such as one module-level dock 112 and one carrier-level dock 104, to the service position in various examples. In various examples, the carrier-level docks 104 and the module-level docks 112 remain connected through the extendable module connector system 400 or the extendable carrier connector system 500, depending on which docks 104,112 are connected to the monolithic carriers. According to various examples, when the second monolithic carrier is moved to the service position, a user may gain access to the first monolithic carrier.

One should note that conditional language, such as, among others, "can," "could," "might," or "may," unless specifically stated otherwise, or otherwise understood within the context as used, is generally intended to convey that certain examples include, while other examples do not include, certain features, elements and/or steps. Thus, such conditional language is not generally intended to imply that features, elements and/or steps are in any way required for one or more particular examples or that one or more particular examples necessarily include logic for deciding, with or without user input or prompting, whether these features, elements and/or steps are included or are to be performed in any particular embodiment.

It should be emphasized that the above-described examples are merely possible examples of implementations, merely set forth for a clear understanding of the principles of the present disclosure. Many variations and modifications may be made to the above-described embodiment(s) without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

That which is claimed is:

1. An extendable connection system comprising:
   a connector cable, the connector cable having a first end and a second end;
   a male connector, the male connector connected to the first end of the connector cable, the male connector including a male connecting mechanism;
   a female connector, the female connector connected to the second end of the connector cable and including a female connecting mechanism adapted to connect with the male connecting mechanism, wherein the male connector is extendable relative to the female connector; and
   a jacket surrounding at least a portion of one of the male connector, the female connector, and the connector cable, a top opening of the jacket being larger than a bottom opening of the jacket.

2. The extendable connection system of claim 1, wherein the male connecting mechanism includes a connector post and a connector key and wherein the female connecting mechanism includes a socket defining a side socket opening and a top socket opening.

3. The extendable connection system of claim 2, wherein the male connector is a first male connector, the extendable connection system further comprising a second male connector adjacent to the female connector, wherein the side socket opening is sized to accept a male connecting mechanism of the second male connector through the side socket opening and into the socket, and wherein the top socket opening is sized to accept the male connecting mechanism of the second male connector through the top socket opening and sized to retain the male connecting mechanism of the second male connector within the socket.

4. The extendable connection system of claim 1, wherein the male connector and the female connector are electrically conductive.

5. The extendable connection system of claim 1, wherein the male connector is in electrical communication with the female connector through the connector cable, and wherein the male and female connectors are configured to transmit data or power signals between separate electrical devices.

6. The extendable connection system of claim 1, wherein the jacket surrounds the female connector.

7. The extendable connection system of claim 1, wherein the jacket is positioned on the connector cable between the male connector and the female connector.

8. The extendable connection system of claim 1, wherein the connection system is disposed in a connector channel of a dock of a midplane docking system.

9. A midplane docking system comprising:
   a dock having a top side and a bottom side, the dock defining a connector channel extending from the top side to the bottom side; and
   a connector positioned within the connector channel, the connector including
   a connector cable, the connector cable having a first end and a second end;
   a male connector, the male connector connected to the first end of the connector cable, the male connector including a male connecting mechanism, wherein the male connecting mechanism includes a connector post and a connector key; and
   a female connector, the female connector connected to the second end of the connector cable and including a female connecting mechanism adapted to connect with the male connecting mechanism, wherein the male connector is extendable relative to the female connector, the female connecting mechanism including a socket having a top socket opening, the top socket opening sized to accept the connector post of the male connecting mechanism through the top socket opening and sized to retain the connector key within the socket; and
   wherein the dock is a first dock, the connector channel is a first connector channel, the connector is a first connector, the connector cable is a first connector cable, the male connector is a first male connector, and the female connector is a first female connector, further comprising:
   a second dock positioned vertically above the first dock, the second dock having a top side and a bottom side, the second dock defining a second connector channel extending from the top side to the bottom side; and
   a second connector positioned within the second connector channel, the second connector comprising:
   a second connector cable, the second connector cable having a first end and a second end;
   a second male connector, the second male connector connected to the first end of the second connector cable, the second male connector including a male connecting mechanism; and
   a second female connector, the second female connector connected to the second end of the second connector cable and including a female connecting mechanism, wherein the second male connector is extendable relative to the second female connector.

10. The midplane docking system of claim 9, wherein the second male connector of the second connector is adapted to mate with the first female connector of the first connector.

11. The midplane docking system of claim 9, further comprising a jacket, wherein the jacket surrounds at least a portion of one of the male connector, the female connector, and the connector cable.

12. The midplane docking system of claim 11, wherein the jacket is positioned on the connector cable between the female connector and the male connector.

13. The midplane docking system of claim 11, wherein a top opening of the jacket is larger than a bottom opening of the jacket.

14. The midplane docking system of claim 9,
wherein the second male connector of the second dock is mated with the first female connector of the first dock.

15. An extendable connection system comprising:
a connector cable, the connector cable having a first end and a second end;
a first male connector, the first male connector connected to the first end of the connector cable, the first male connector including a first male connecting mechanism, the first male connecting mechanism comprising a first connector post and a first connector key; and
a female connector, the female connector extendable relative to the first male connector, the female connector connected to the second end of the connector cable and including a female connecting mechanism configured to connect with a second male connecting mechanism of a second male connector, the female connecting mechanism comprising a socket, the socket defining a side socket opening and a top socket opening, the top socket opening sized to accept a connector post of the second male connecting mechanism, the top socket opening sized to retain a connector key of the second male connecting mechanism within the socket.

16. The extendable connection system of claim 15, wherein the side socket opening is sized to receive the connector key of the second male connecting mechanism.

17. The extendable connection system of claim 15, wherein:
the extendable connection system of claim 15 is disposed within a connector channel defined by a dock; and
the connector channel extends through the dock from a top side of the dock to a bottom side of the dock.

18. The extendable connection system of claim 17, wherein the female connector is positioned at the top side and the first male connector is positioned at the bottom side.

19. The extendable connection system of claim 17, wherein:
the dock is a first dock;
the connector channel is a first connector channel;
the extendable connection system further comprises a second dock;
the second dock defines a second connector channel; and
the second male connector is disposed within the second connector channel.

* * * * *